(12) United States Patent
Chou (10) Patent No.: US 11,264,957 B2
(45) Date of Patent: Mar. 1, 2022

(54) STRUCTURE AND METHOD OF AUDIO AMPLIFIER BY DYNAMIC IMPEDANCE ADJUSTMENT

(71) Applicant: Chung-Fu Chou, Yongkang (TW)

(72) Inventor: Chung-Fu Chou, Yongkang (TW)

( * ) Notice: Subject to any disclaimer, the term of this patent is extended or adjusted under 35 U.S.C. 154(b) by 67 days.

(21) Appl. No.: 16/683,344

(22) Filed: Nov. 14, 2019

(65) Prior Publication Data
US 2020/0220507 A1    Jul. 9, 2020

(30) Foreign Application Priority Data

Jan. 4, 2019  (TW) .................. 108100324

(51) Int. Cl.
| | | |
|---|---|---|
| H03F 1/34 | (2006.01) | |
| H03F 1/56 | (2006.01) | |
| H03F 3/183 | (2006.01) | |
| H03F 3/21 | (2006.01) | |

(52) U.S. Cl.
CPC ............. H03F 3/183 (2013.01); H03F 1/34 (2013.01); H03F 1/565 (2013.01); H03F 3/21 (2013.01); *H03F 2200/03* (2013.01); *H03F 2203/21139* (2013.01)

(58) Field of Classification Search
CPC . H03F 3/183; H03F 3/21; H03F 1/565; H03F 1/34; H03F 2203/21139; H03F 2200/03; H03F 3/26; H03F 3/211; H03F 2203/45138; H03F 2200/541; H03F 3/45475; H03F 2203/45528; H03F 3/187

USPC .............. 330/252–261, 10, 251, 207 A
See application file for complete search history.

(56) References Cited

U.S. PATENT DOCUMENTS

| | | | | |
|---|---|---|---|---|
| 7,053,705 B2* | 5/2006 | Hench | ...... | H03F 1/08 330/102 |
| 7,202,742 B2* | 4/2007 | Nakagaki | ...... | H03F 3/217 330/102 |
| 9,647,614 B2* | 5/2017 | Otani | ...... | H03F 1/342 |

* cited by examiner

*Primary Examiner* — Hieu P Nguyen
(74) *Attorney, Agent, or Firm* — Alan D. Kamrath; Karin L. Williams; Mayer & Williams PC (57) ABSTRACT

The present invention generally relates to a structure and method of audio amplifier by dynamic impedance adjustment, including a power amplifying unit, a loud-speaker, a current sensing unit and a subtraction unit. The power amplifying unit has a fixed closed loop gain, with an input side and an output side; the loud-speaker is electrically connected to the output side of the power amplifying unit; the current sensing unit senses the output current of the power amplifying unit, and the sensed output current is converted into a current control voltage signal; the subtraction unit inputs the audio voltage signal and the feedback current control voltage signal, and outputs the difference of the audio voltage signal minus the current control voltage signal, and inputs it to the input side of the power amplifying unit. The output sound quality of the loud-speaker is improved by dynamic impedance adjustment.

8 Claims, 11 Drawing Sheets

PRIOR ART

FIG.8

PRIOR ART

FIG.9

PRIOR ART

FIG.10

PRIOR ART

FIG.11

STRUCTURE AND METHOD OF AUDIO AMPLIFIER BY DYNAMIC IMPEDANCE ADJUSTMENT

FIELD OF THE INVENTION

The present invention generally relates to a structure and method of audio amplifier by dynamic impedance adjustment, and more particularly to a structure and method for feed backing and controlling the output power of the control amplifier and improving the output quality of the loud-speaker due to the change of the of the loud-speaker impedance.

DESCRIPTION OF RELATED ART

Figure 8:
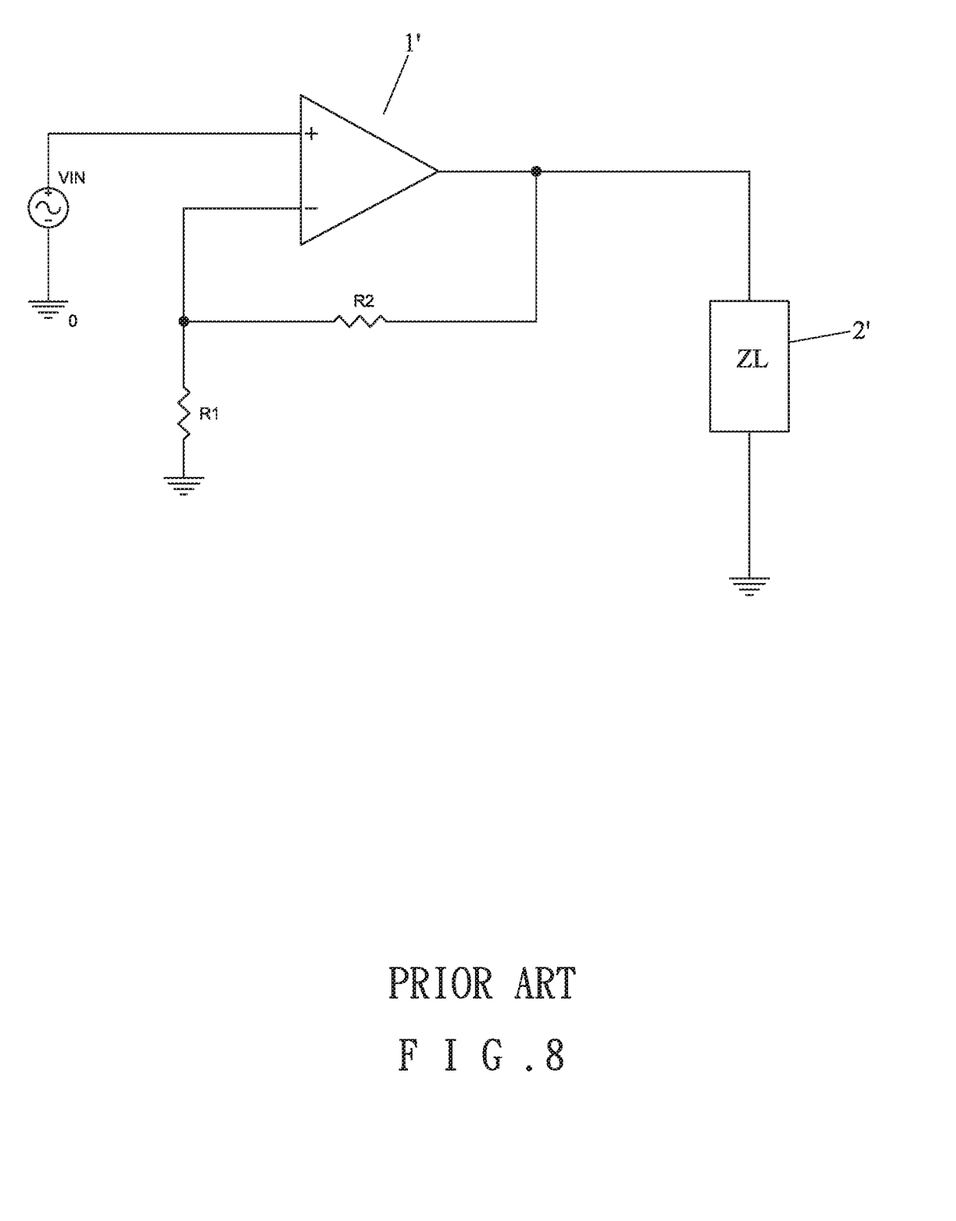
FIG. 8 is a schematic diagram of the conventional audio amplifier circuit structure.

Please refer to FIG. 8, a conventional audio amplifier circuit structure includes a power amplifier 1', a speaker 2' disposed on the output side of the amplifier 1', the input side of the power amplifier 1' is connected to a negative feedback resistor R2 and a resistor R1 that is grounded, the audio voltage Vin is inputted from the positive end of the power amplifier 1', and the output voltage of the power amplifier 1' is VO=Vin*(R2/R1+1), so the output power of the power amplifier 1' is PO=(VO)$^2$/ZL.

Figure 9:
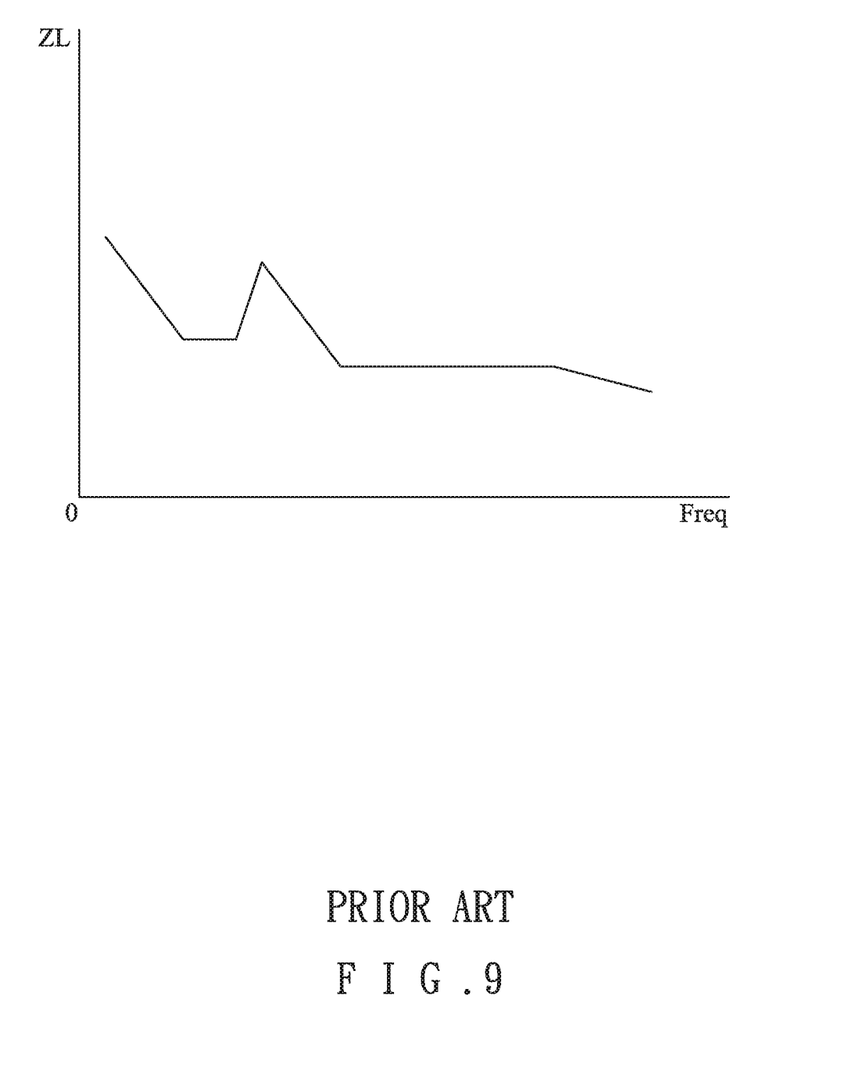
FIG. 9 is a schematic diagram of the conventional loud-speaker impedance variation in the range of 20~20 KHZ.
Figure 10:
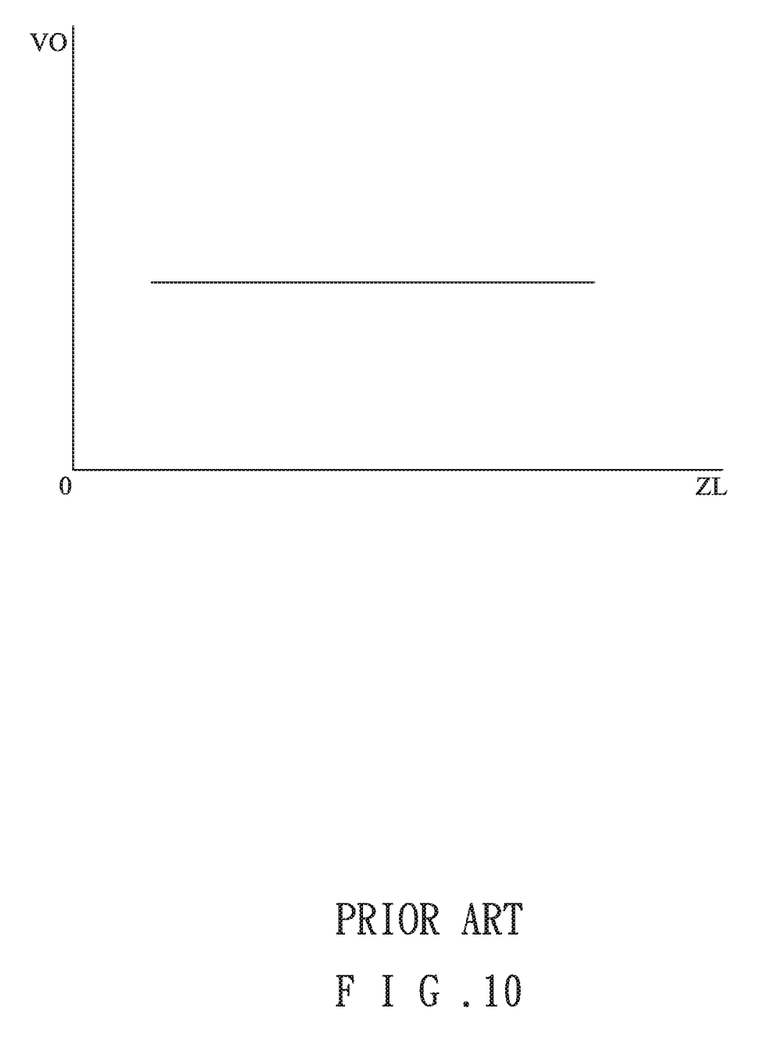
FIG. 10 is a schematic diagram of the conventional loud speaker impedance comparison output voltage.
Figure 11:
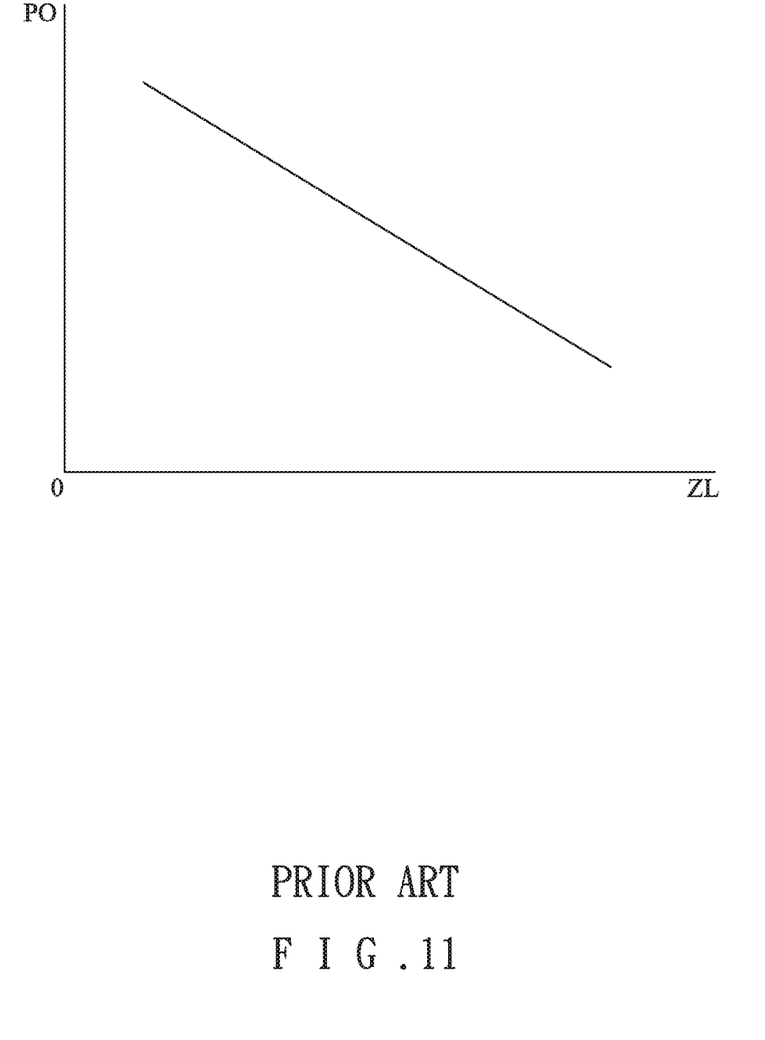
FIG. 11 is a schematic diagram of the conventional loud speaker impedance comparison output power.

However, the DC impedance ZL of the loud-speaker 2' is not a fixed value and generally in the range of 4~16Ω, and its AC impedance is a nonlinear variation as shown in FIG. 9 in the audio range of 20~20 KHZ, so that the conventional power amplifier 1' is practically shown as shown in FIG. 10, the difference in the DC impedance ZL of the loud-speaker 2' will not cause the different output voltage VO under the condition of the same input audio voltage Vin, but as shown in FIG. 11, the impedance ZL change will directly cause the different output PO of the power amplifier 1' under the same input audio voltage Vin signal level. This phenomenon will damage the amplifier due to insufficient maximum power bearing capacity, and the natural uneven/impedance of the loud-speaker 2' will cause the playback music distortion and poor output quality.

Therefore, although the output sound quality can be improved by the high-quality loud-speaker, it is still difficult to avoid the default of output distortion caused by the frequency/impedance of the loud-speaker itself.

SUMMARY OF THE INVENTION

The purpose of the present invention is to provide a structure and method for feeding back and controlling the output power of the amplifier and improving the output quality of loud-speaker by the impedance variation of loud speaker.

The audio amplifier structure of the dynamic impedance adjustment of the present invention includes a power amplifying unit, a loud-speaker, a current sensing unit and a subtraction unit; the power amplifying unit has a fixed closed loop gain, and it can be a class A, class AB, class D and class G amplifier, and the structure can be a single-ended amplification or bridging BTL structure with an input side and an output side; and the loud-speaker is electrically connected to the output side of the power amplifying unit; the current sensing unit senses the output current of the power amplifying unit, the sensed output current is converted into a current control voltage signal matched with the loud-speaker frequency/impedance; and the subtraction unit inputs the audio voltage signal and feeds back the current control voltage signal, and outputs the difference value of the audio voltage signal minus the current control voltage signal, and then inputs it to the input side of the power amplifying unit.

The audio amplifier of the dynamic impedance adjustment of the present invention includes:

disposing a power amplifying unit, the power amplifying unit is outputted to a loud-speaker;

selecting the current signal outputted from the power amplifying unit to the loud-speaker;

the current signal is converted into a current control voltage signal matched with the loud-speaker frequency/impedance;

the input audio voltage signal is combined with the current control voltage signal and then inputted into the power amplifying unit, thereby reducing the output power of the power amplifying unit affected by the loud-speaker impedance variation.

Further, the present invention includes a subtraction unit that inputs an audio voltage signal and a current control voltage signal, and outputs a difference between the audio voltage signal and the current control voltage signal and then inputs it into the power amplifying unit.

Further, the present invention includes a current sensing unit that senses a voltage signal corresponding to the output current of the power amplifying unit, and a parameter corresponding to the loud-speaker is combined with the voltage signal to obtain a current control voltage signal.

The present invention can dynamically adjust the output power level by the natural uneven frequency/impedance of the loud-speaker through the feedback circuit, which can reduce the influence of the impedance fluctuation of the loud-speaker, and obtain the function of the low distortion signal playback characteristic, and it can ensure that the audio amplifier can stabilize the action and prolong the service life.

DETAILED DESCRIPTION OF THE INVENTION

Figure 1:
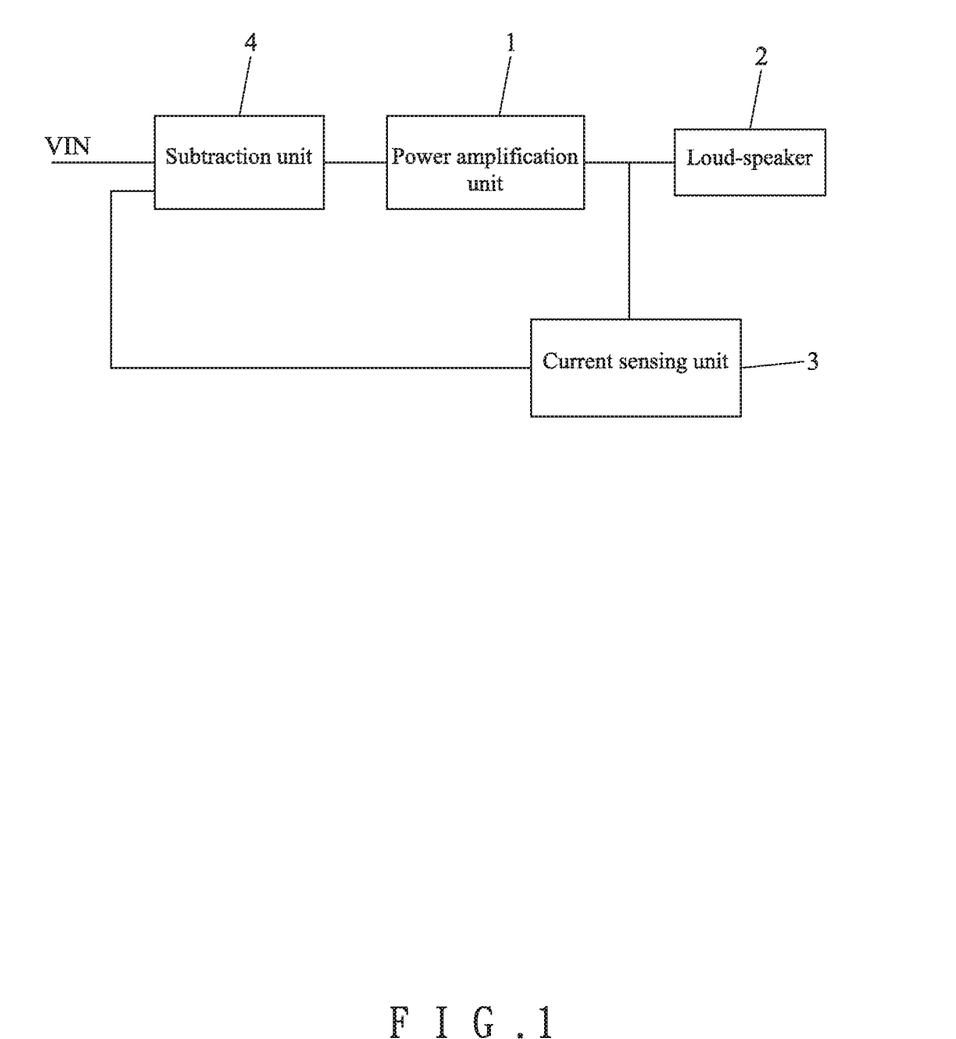
FIG. 1 is a schematic diagram of the circuit structure of the present invention.

Referring to FIG. 1, the structure of the present invention includes a power amplifying unit 1, a loud-speaker 2, a current sensing unit 3 and a subtraction unit 4, the power amplifying unit 1 includes a fixed closed loop gain, which can be a class A, class AB, class D and class G amplifier, its structure can be the single-ended amplification or bridging BTL structure with input side and output side.

The loud-speaker 2 is electrically connected to the output side of the power amplifying unit 1.

The current sensing unit 3 senses the output current of the power amplifying unit 1, and the sensed output current is converted into a current control voltage signal matched with the loud-speaker 2 frequency/impedance.

The subtraction unit 4 inputs the audio voltage Vin signal and feeds back the current control voltage signal, and outputs the difference between the audio voltage Vin signal minus the current control voltage signal and then inputs it into the input side of the power amplifying unit 1.

Figure 2:
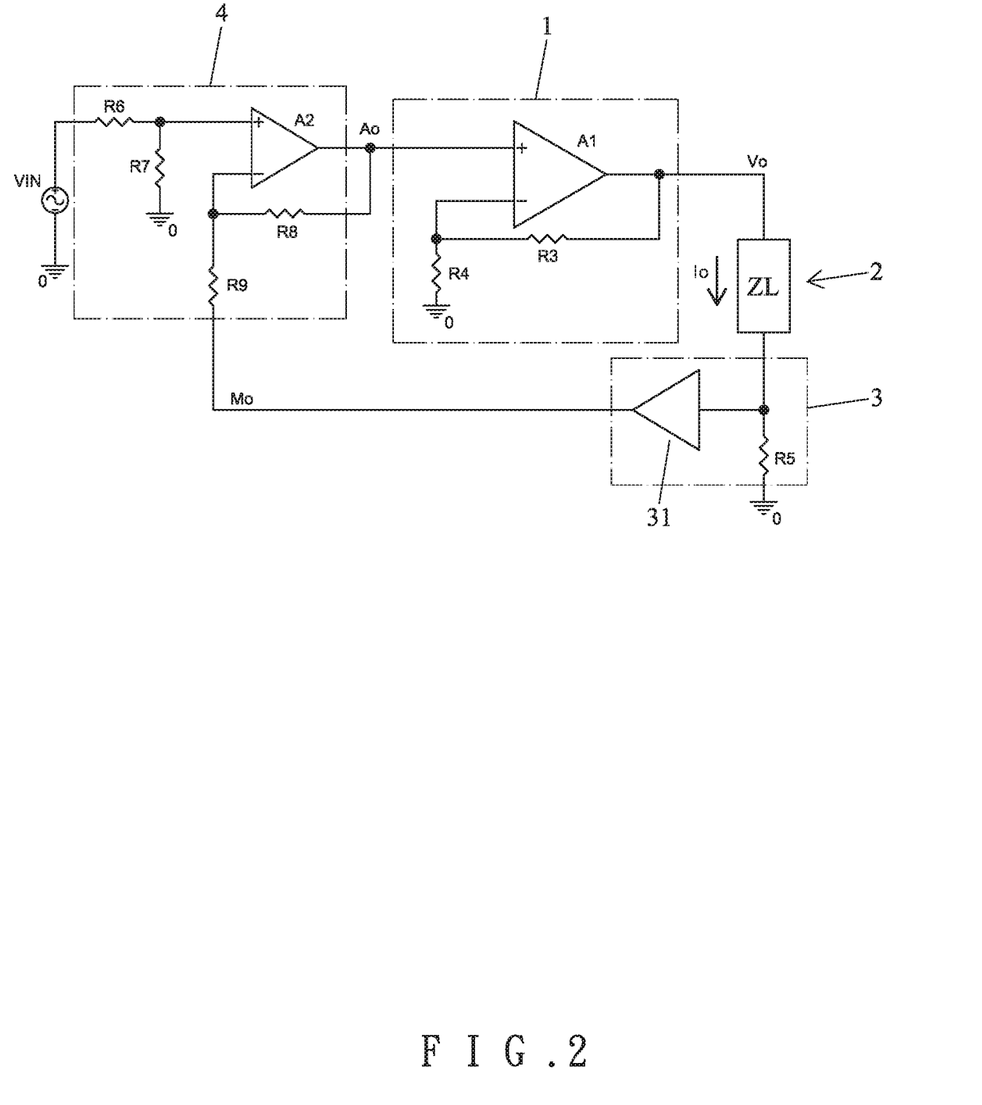
FIG. 2 is a circuit schematic diagram of the first embodiment of the present invention.

Please refer to FIG. 2, the power amplifying unit of the circuit in the first embodiment of the present invention includes an amplifier A1, and also includes a resistor R3 and a resistor R4 connected to the negative input end of the amplifier A1, with a voltage gain of A=(R3/R4+1), its output voltage is VO, the output current is IO, the amplifier A1 output is electrically connected to the loud-speaker 2; the loud-speaker 2 impedance is ZL, the output power of the amplifier A1 is PO=VO*IO; IO=VO/ZL.

The current sensing unit 3 senses the output current IO, and includes a current sensing resistor R5 and a gain device 31 amplified by G times, and can sense the voltage of the output current IO and generate a current control voltage MO; wherein the impedance of the current sensing resistor R5 is much smaller than the impedance ZL of the loud-speaker 2, which will not cause a significant change in the IO value. The MO=IO*R5*G=(VO/ZL)*B; B=R5*G, wherein the G and B values are the frequency/impedance value matched with the loud-speaker 2, which can be changed for different loud-speaker 2.

The subtraction unit 4 includes an amplifier A2, a resistor R6, a resistor R7, a resistor R8 and a resistor R9, and respectively inputs an audio voltage MO signal and a current control voltage MO signal, so that R6=R7=R8=R9, the subtraction unit 4 and the amplifier A2 output AO=Vin−MO=Vin−[(B*VO)/ZL].

Figure 3:
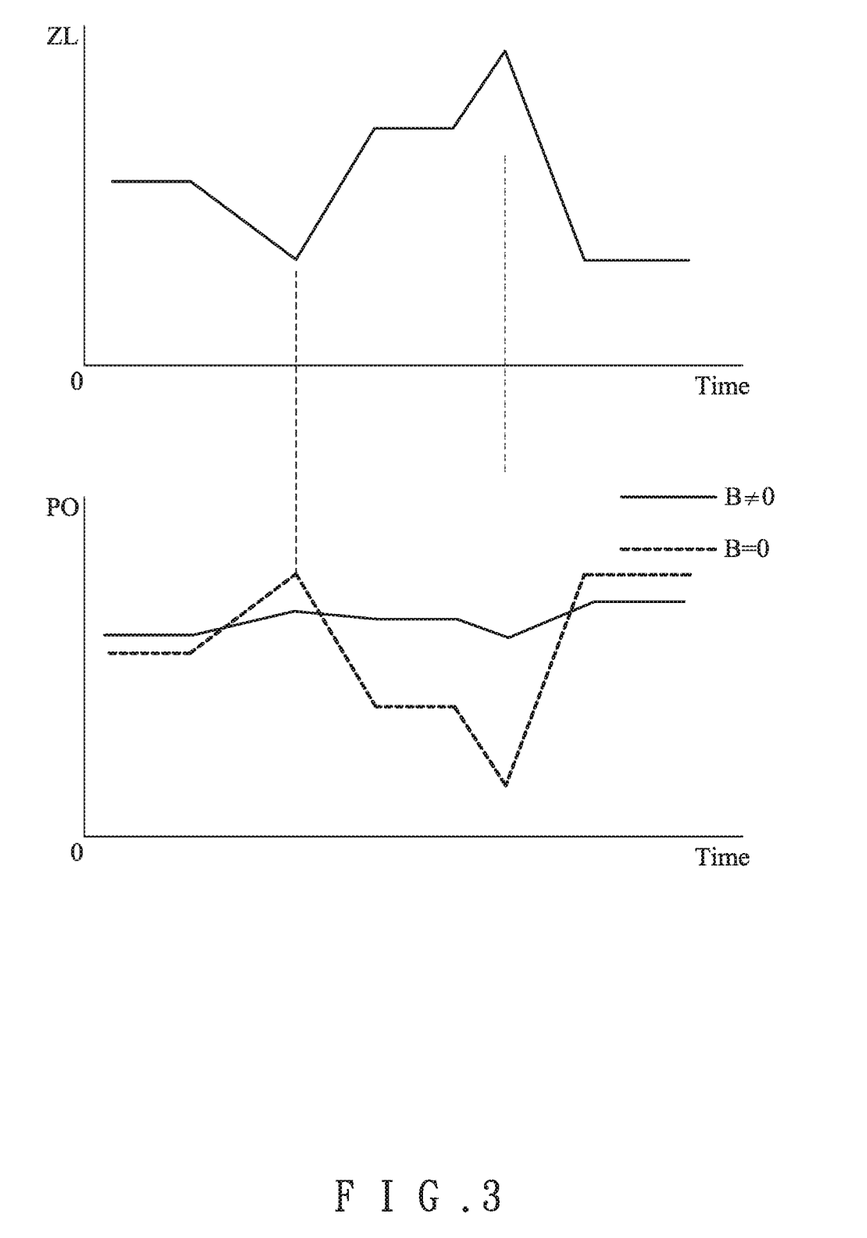
FIG. 3 is a circuit schematic diagram of the output power variation and suppression of caused by loud speaker impedance variation of the first embodiment of the present invention.

Please refer to FIG. 2 and FIG. 3, in the present invention, when the G=0 and B=0, the current control voltage MO=0, AO=Vin, the VO=AO*A=Vin*A, which can be like the conventional audio amplification mode, however, when the loud-speaker 2 impedance ZL changes due to the frequency/impedance unevenness characteristic, the output power PO of the amplifier A1 will also affect the output quality due to the corresponding change as indicated by the dotted line in FIG. 3.

The present invention can be combined with the loud-speaker 2 to set the G value of the gain device 31, and obtain a preferred B value matched with the loud-speaker 2, when the same audio voltage Vin signal is inputted and the loud-speaker 2 impedance ZL changes, the current control voltage MO outputted from the current sensing unit 3 can show the impedance ZL change of the loud-speaker 2 and then input it to the subtraction unit 4, the subtraction unit 4 outputs AO=Vin−MO, and VO=AO*A=(Vin−Mo)*A, the output power PO=VO$^2$/ZL−[(Vin−MO)*A]$^2$/ZL, wherein the MO=(VO/ZL)*B, so, when the impedance ZL of the loud-speaker 2 changes, the B value changes, at the same time, the current control voltage MO, the change of the output voltage VO and the output power PO are corrected correspondingly, so that the output power PO level is suppressed and adjusted, as shown by the solid line in FIG. 3, the flat output will not change dramatically with the change of the loud-speaker 2 impedance ZL.

Figure 4:
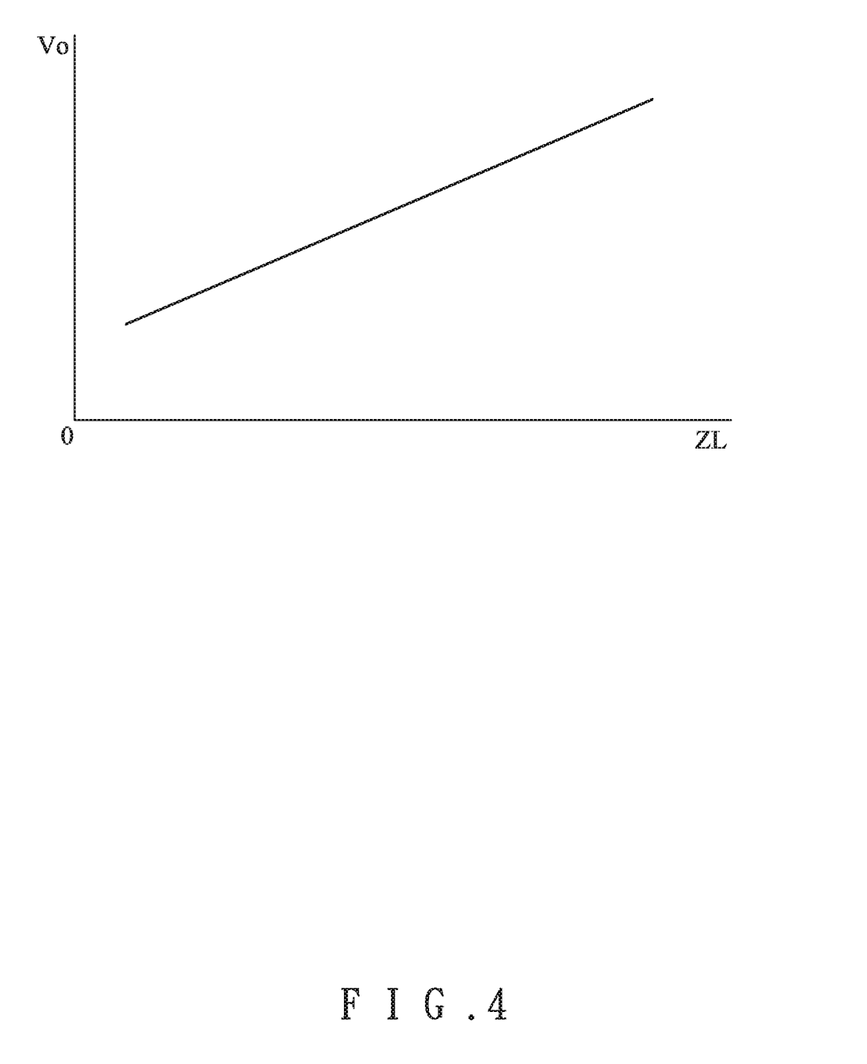
FIG. 4 is a schematic diagram of the loud speaker impedance comparison output voltage of the first embodiment of the present invention.
Figure 5:
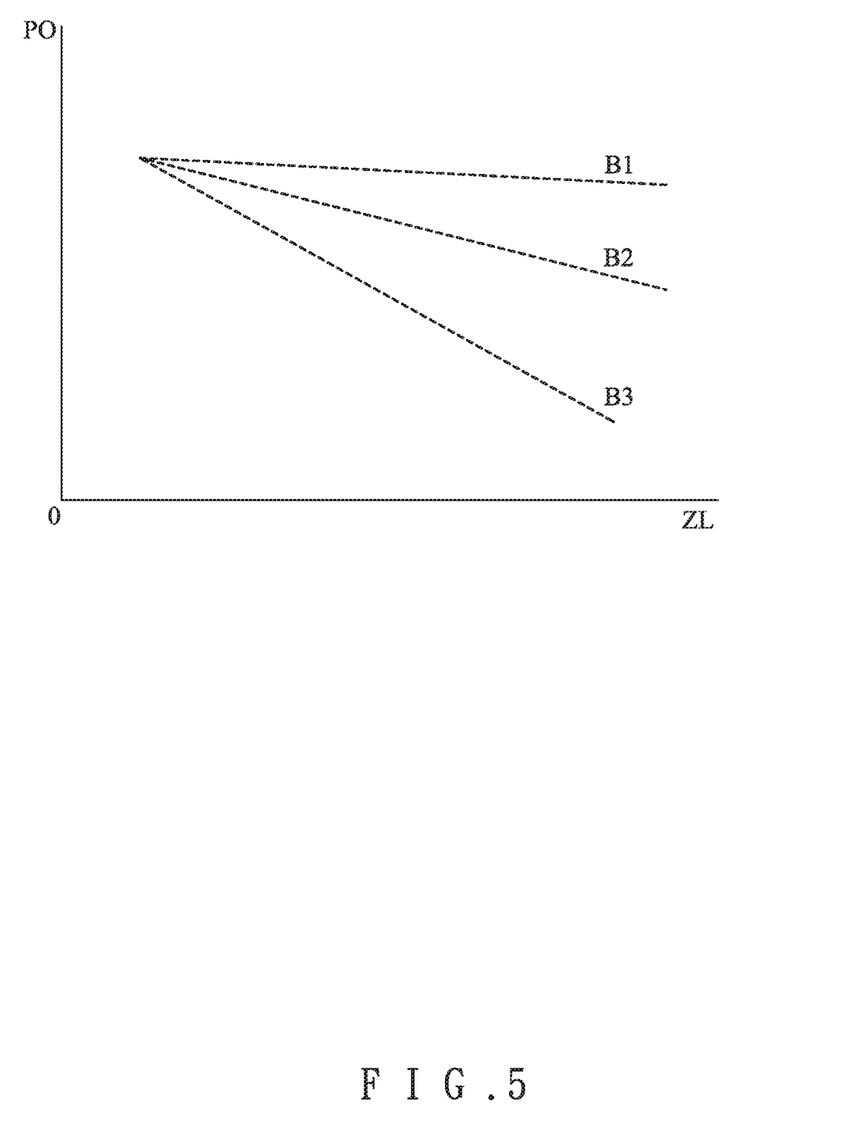
FIG. 5 is a schematic diagram of the loud speaker impedance comparison output power with different B parameters set of the first embodiment of the present invention.

Please refer to FIG. 2 and FIG. 4, the characteristics of the present invention are that the IO and MO increase when the impedance ZL of the loud-speaker 2 increases and the VO increases, vice versa, the VO will decrease when the impedance ZL decreases, which can stabilize the output power to suppress the influence of ZL change. As shown in FIG. 2 and FIG. 5, the B parameter of the present invention means the feedback weight amount corresponding to the loud-speaker 2, so that the amplification system outputs the power PO in the operable range and the loud-speaker 2 impedance ZL correlation is limited. As shown in FIG. 5, the present invention can be combined with different loud-speakers to select the appropriate B parameters (B1, B2 and B3) to obtain a stable output power PO, B parameters can be adjusted by the present invention to provide the appropriate matched impedance, so that the power amplifying unit 1 to loud-speaker 2 can have both proper power conversion efficiency and better frequency response performance.

Figure 6:
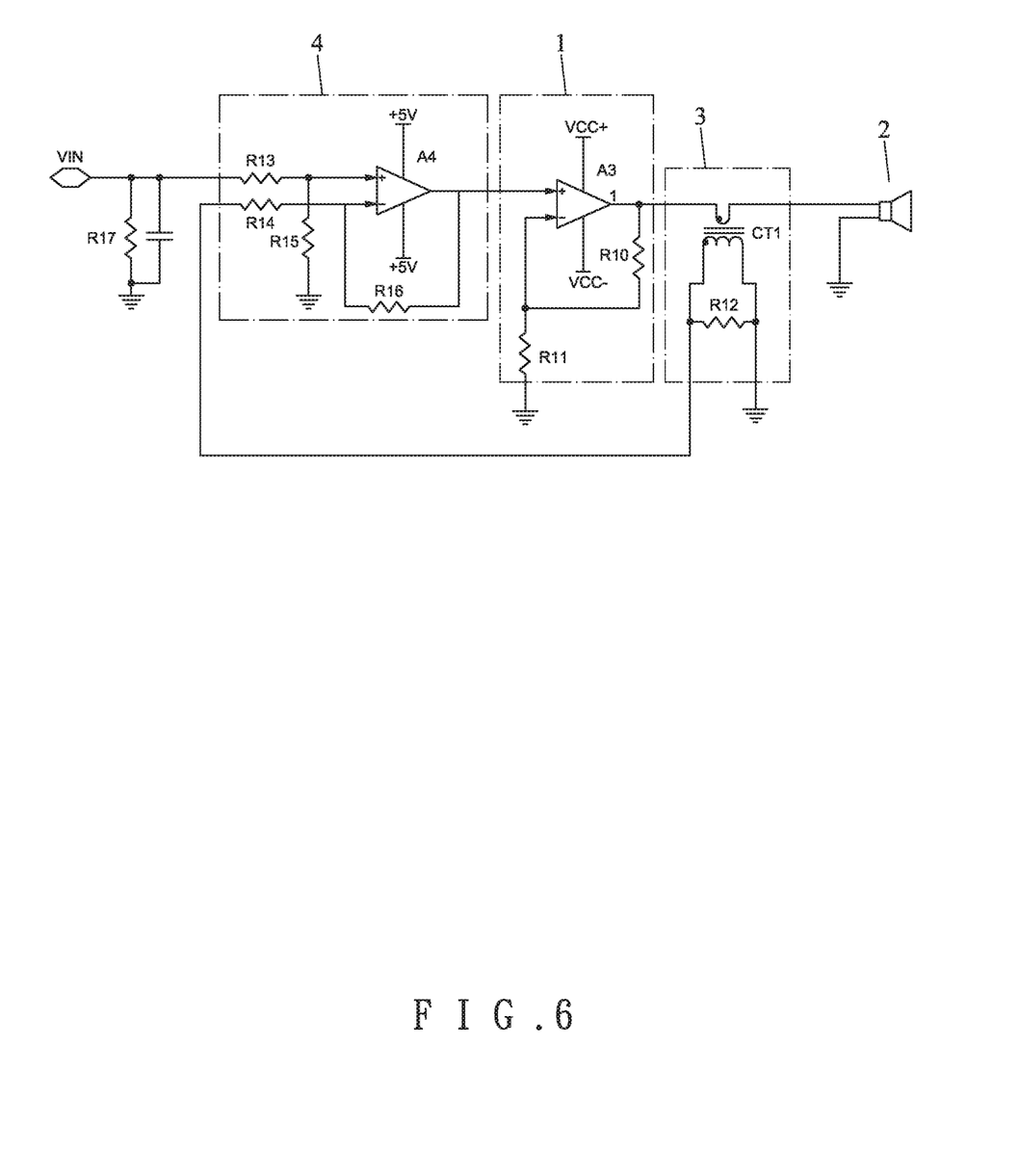
FIG. 6 is a schematic diagram of the circuit structure of the second embodiment of the present invention.

FIG. 6 is a second embodiment of the present invention. The second embodiment includes a power amplifying unit 1, a loud-speaker 2, a current sensing unit 3 and a subtraction unit 4, and the power amplifying unit 1 is mainly composed of an amplifier A3, a resistor R10 and a resistor R11. A positive input end is connected to the output voltage of the subtraction unit 4, and an amplifier A3 outputs it to the loud-speaker 2; and the current sensing unit 3 mainly includes a current sensing transformer CT1 and a resistor R12, and it is connected to the output side of the amplifier A3 and senses the output current of the amplifier A3 to obtain a current control voltage signal of the loud-speaker 2 impedance ZL due to the fluctuation of the frequency/impedance; the selected appropriate current sensing transformer CT1 and the resistor R12 may obtain the corresponding current control voltage signal function by selecting the appropriate B parameter matched with the loud-speaker 2 as shown in the first embodiment; and the subtraction unit 4 mainly includes an amplifier A4, a resistor R13, a resistor R14, a resistor R15 and a resistor R16, and inputs the audio voltage Vin signal and current control voltage signal, so that the audio voltage Vin signal and the subtraction current control voltage signal are inputted to the amplifier A3, so as to input the same audio voltage Vin signal, but when the loud-speaker 2 impedance ZL changes, the amplifier A3 output variation can be suppressed to maintain near constant output power to reduce distortion and improve output sound quality.

Figure 7:
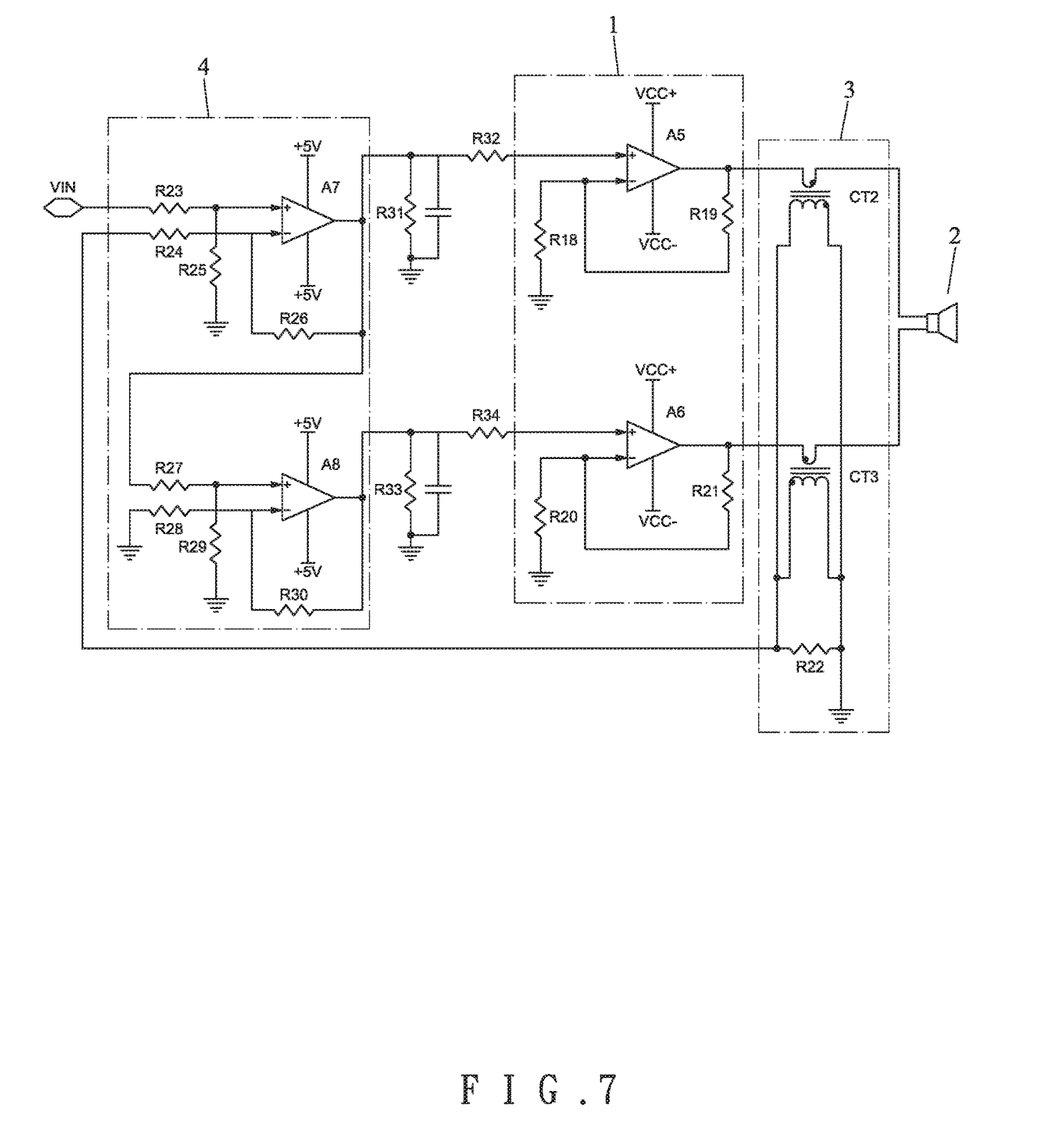
FIG. 7 is a schematic diagram of the circuit structure of the third embodiment of the present invention.

FIG. 7 is a third embodiment of the present invention. The third embodiment is similar to the second embodiment, and includes a power amplifying unit 1, a loud-speaker 2, a current sensing unit 3 and a subtraction unit 4, and it is a BTL bridging structure, the power amplifying unit 1 mainly includes an amplifier A5, a resistor R18, a resistor R19 and an amplifier A6, two sets of power amplifier circuit are composed of a resistor R20 and a resistor R21, and an amplifier A5 and an amplifier A6 are outputted to the loud-speaker 2; the current sensing unit 3 mainly includes two current sensing transformers of CT2 and CT3 as well as a resistor R22. The current sensing transformer CT2 and current sensing transformer CT3 are electrically connected to the output sides of the amplifier A5 and amplifier A6 respectively, and the output currents sensed by the amplifier A5 and A6 are converted into the current control voltage signal re-inputted to the subtraction unit 4, and the selected appropriate current sensing transformer CT2 and CT3 as well as the resistor R22 may obtain the corresponding current control voltage signal function by selecting the current sensing transformer CT2 and CT3 s well as a resistor R22 as shown in the first embodiment; the subtraction unit 4 is mainly composed of an amplifier A7, the resistor R23~R26, an amplifier A8 and the resistor R27~R30. The amplifier A7 inputs an audio voltage Vin signal and a current control voltage signal. The difference voltage signal of the current control voltage signal subtracted by the audio voltage Vin signal is inputted to the input side of the amplifier A5, and the difference voltage signal is inputted to the positive input end of the amplifier A8. The negative input end of the amplifier A8 inputs the ground voltage, so the amplifier A8 correspondingly outputs the difference voltage signal to the amplifier A6, and the amplifier A5 and A6 of the power amplifying unit 1 are re-amplified and outputted to the loud-speaker 2, so that the amplifier A5, A6 output variation can be suppressed when the impedance ZL of the loud-speaker 2 changes, for maintaining to output the near constant power and to reduce the distortion and to improve the output sound quality.

Although the invention has been explained in relation to its preferred embodiment, it is to be understood that many other possible modifications and variations can be made without departing from the spirit and scope of the invention as hereinafter claimed.

The invention claimed is:

1. A structure of an audio amplifier with dynamic impedance adjustment comprises:
a power amplifying unit with a fixed closed loop gain, an input side and an output side to generate an output current;
a loudspeaker electrically connected to the output side of the power amplifying unit to generate an output voltage;
a current sensing unit configured to sense the output current of the power amplifying unit output to the loudspeaker, and to convert the output current into a current control voltage signal that matches a frequency and impedance of the loudspeaker,
wherein the current sensing unit includes a gain device that is electrically connected to the loudspeaker and a current sensing resistor that is electrically connected to the gain device, and
wherein the gain device has a setting value that matches the loudspeaker frequency and impedance and the current sensing resistor has a setting impedance that is smaller than the impedance of the loudspeaker;
a subtraction unit with inputs receiving an audio voltage signal and the current control voltage signal, wherein the difference between the audio voltage signal minus the current control voltage signal is output to the input side of the power amplifying unit,
wherein when the impedance of the loudspeaker changes, the current control voltage signal, output voltage and the output power are corrected correspondingly to reduce the influence on the output power of the power amplifying unit due to loudspeaker impedance variation.

2. The structure of audio amplifier by dynamic impedance adjustment defined in claim 1, wherein the power amplifying unit a single-ended amplification or a bridging BTL structure.

3. The structure of audio amplifier by dynamic impedance adjustment defined in claim 1, wherein the current sensing unit includes at least one current sensing transformer.

4. A method of audio amplifier by dynamic impedance adjustment comprises:
setting a power amplifying unit, wherein an output current signal from the power amplifying unit is outputted to a loud-speaker;
selecting the output current signal outputted from the power amplifying unit to the loud-speaker at a current sensing unit;
converting the output current signal into a current control voltage signal matched with a frequency and impedance of the loud-speaker; and
inputting an audio voltage signal combined with the current control voltage signal into the power amplifying unit, and reducing the influence on the output power of the power amplifying unit due to loud-speaker impedance variation.

5. The method of audio amplifier by dynamic impedance adjustment defined in claim 4, wherein the method includes receiving an audio voltage signal and a current control voltage signal at inputs to a subtraction unit, and outputting a difference between the audio voltage signal and the current control voltage signal at an output of the subtraction unit, and receiving the output at an input to the power amplifying unit.

6. The method of audio amplifier by dynamic impedance adjustment defined in claim 4, wherein the method includes sensing the voltage signal corresponding to the output current of the power amplifying unit at a current sensing unit, and setting a parameter corresponding to the frequency/impedance of the loud-speaker and combined with the voltage signal to obtain the current control voltage signal.

7. The method of audio amplifier by dynamic impedance adjustment defined in claim 6, wherein the current sensing unit includes a current sensing resistor.

8. The method of audio amplifier by dynamic impedance adjustment defined in claim 4, wherein the method includes sensing a voltage signal corresponding to the output current of a power amplifying unit at a current sensing unit, the current sensing unit including at least one current sensing transformer.

* * * * *